FEEDBACK AMPLIFIER CIRCUIT

Filed June 7, 1957 2 Sheets-Sheet 1

INVENTOR.
FRANK S. BOXALL
BY
Lippincott, Smith & Ralls
ATTORNEYS

Nov. 15, 1960 F. S. BOXALL 2,960,660

FEEDBACK AMPLIFIER CIRCUIT

Filed June 7, 1957 2 Sheets-Sheet 2

INVENTOR.
FRANK S. BOXALL

BY

Lippincott, Smith + Ralls

ATTORNEYS

United States Patent Office 2,960,660

Patented Nov. 15, 1960

2,960,660

FEEDBACK AMPLIFIER CIRCUIT

Frank Stuart Boxall, Palo Alto, Calif., assignor to Lenkurt Electric Co., Inc., San Carlos, Calif., a corporation of Delaware Filed June 7, 1957, Ser. No. 664,221

1 Claim. (Cl. 330—91)

This invention relates to amplifiers, and particularly to the output or power stages of such amplifiers. It is applicable to any type of amplifying element wherein the amplitude gain (referred to either a control current or a control voltage) approaches unity and power amplification is achieved by an impedance transformation as between the input and output circuits. The broad aspects of the invention can be applied either to amplifiers wherein the output current approaches equality with the input current and the output impedance is high in comparison with the input impedance, as is the case with grounded-base transistors or grounded-grid vacuum tubes, and to amplifiers wherein the output voltage approaches equality with the input voltage and the output impedance is low in comparison with the impedance of the input, as in grounded-collector transistors and cathode-follower vacuum tubes.

The broad purpose of the invention is to provide means for reducing the distortion inherent in the output stages of amplifiers generally. In preamplifier stages adequate means exist for maintaining distortion at extremely low values. Where material power is to be handled the nonlinear characteristics of substantially all presently-known amplifying devices become increasingly important as the amplitude of the signals to be handled increases and substantially all of the distortion that occurs in any well-designed amplifier occurs in the output or power stage, the percentage of distortion increasing rapidly with the amplitude of the signals. The present invention is in theory capable of reducing the output distortion, due to nonlinearity of the amplifying element used, to zero; in practice it is possible to approach this over a very wide band of frequencies and amplitudes and to reduce distortion so introduced to a small fraction of that produced by like amplifying elements, when used in conventional fashion, over a still wider band of frequencies and amplitudes, this being the case whether the distortion appears as amplitude, harmonic, or phase distortion.

Ancillary to the broad purpose of decreasing distortion, among the objects of the invention are to provide a feedback circuit having the property of maintaining the amplitude gain of an amplifying element at substantially unity; to provide a feedback method and arrangement which is inherently stable under all conditions of operation; to provide an amplifier of simple and straight-forward construction, whose constants and performance over a given frequency band can be accurately predicted, and to provide a type of feedback amplifier the gain whereof is increased instead of decreased in reducing the distortion.

Amplifiers of the type here considered, wherein power amplification is achieved owing to a difference in impedance between the input and output, are characterized by the fact that the amplitude gain approaches but does not equal unity. It will be evident that if the amplitude of the output signal were always exactly equal to that of the input signal no distortion would be introduced by the amplifying device itself; any distortion must be included in the difference in amplitude between the input and output signals. More specifically, distortion is due to a variation in the ratio of the instantaneous amplitudes of the input and output signals with amplitude or frequency, and may appear as amplitude, harmonic, or phase distortion.

Broadly considered, the present invention comprises the combination with an amplifier of the type wherein the amplitude gain approaches unity with means for deriving an error signal whose amplitude is substantially equal to the difference between the amplitudes of the input and output signals and means for adding the difference or error signal so derived to the input signal, in such phase as to increase its amplitude by the amount of the error signal. The output signal then becomes substantially equal to the input signal and under proper conditions exactly equal thereto.

In practical applications of the invention the limitations of realizable circuits may prevent the attainment of exact unity between the difference or error signal and the signal added to the original input, over all or a part of the band which the amplifier may be required to handle. It will be shown hereinafter that a reduction in distortion is attained if the added signal is equal to the difference signal multiplied by a factor K which is greater than zero and less than 2, with an optimum value of 1.

The invention will be more clearly understood from the detailed description that follows; both of the theory involved and of certain preferred embodiments of the invention. This description is illustrated by the accompanying drawings wherein.

Figure 1:
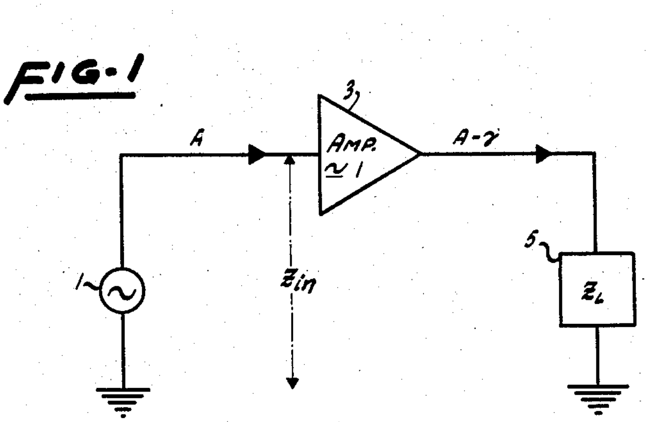
Fig. 1 is a symbolic drawing of a conventional amplifier having an amplitude gain approaching unity.

In Fig. 1 there is shown a signal source 1, the nature of which is unimportant to the present invention. The source delivers a signal of amplitude A to an amplifier 3, the amplitude gain whereof approaches but does not equal 1, at least at all frequencies and amplitudes within the band that the amplifier is required to handle. The amplifier 3 has an input impedance of $Z_{in}$. It delivers an output signal $A_0=A\alpha_L$ to a load impedance $Z_L$, the amplitude of the output signal differing from A by some small quantity, $A(1-\alpha_L)$, where $\alpha_L$ is the amplitude gain of the amplifier when connected to the load $Z_L$. The power gain is achieved owing to the fact that $Z_{in}$ and $Z_L$ differ greatly in value; if the control amplitude represents current, $Z_{in}$ must be small in comparison to $Z_L$; if the control signal delivered by the source 1 is a voltage the reverse is the case.

In substantially all practical amplifiers some distortion occurs; i.e., the output signal is not an exact replica of the input signal, on a different scale, but differs from it in waveform or phase. In order to take account of this fact, the symbol "A" will be used hereinafter to designate the "instantaneous amplitude" of the control or input signal; i.e., the value of the A.C. component of that signal at any instant of time.

Figure 2:
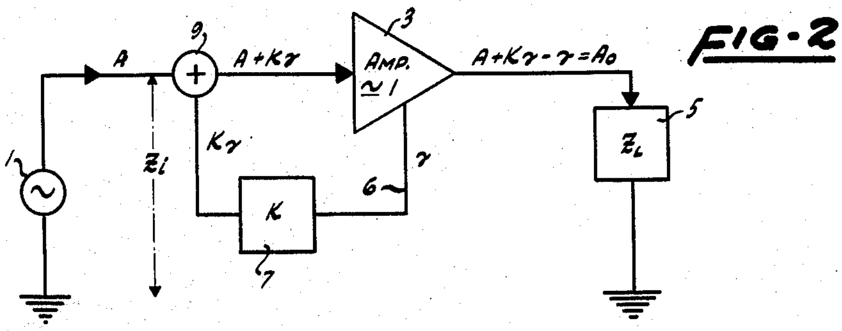
Fig. 2 is a similar symbolic drawing of an amplifier employing the type of feedback of the present invention.

In accordance with the present invention the circuit in Fig. 1 is modified as is indicated in Fig. 2. Means are provided for deriving a signal whose instantaneous value is at all times the difference between the input and output signals as supplied to and delivered from the amplifier 3, this signal being denominated as $\gamma$. Since this signal represents the difference between the input and the output of the amplifier it includes any distortion components introduced by the amplifier itself, and hence can conveniently be referred to as the "error signal." It is supplied through the lead 6 to an element 7, where it is multiplied by a factor K, which should be substantially unity, and thence to an adding circuit 9 where it is combined with the signal of instantaneous amplitude A from the source 1 and thence the combined signal is fed back to the input of amplifier 3. The instantaneous magnitude of the signal at the input is therefore $A+K\gamma$ and since $\gamma$ is itself the difference between the input and output, the signal supplied to the load impedance $Z_L$ is $A+K\gamma-\gamma$ which, if K is unity, it is equal to the input A. Since, as has been shown, $\gamma$ includes all distortion components, under these circumstances the output is distortion free. If K is not exactly unity, the distortion will be reduced but not wholly eliminated; an improvement is effected for any value of K that is near unity; i.e., where K is greater than zero and less than 2.

The quantity K represents all changes in amplitude or phase of the error signal in the feedback loop, including any errors incident to the method of deriving the difference signal and attenuation or amplification in the loop and in the circuitry by which it is added to the initial message signal. K may therefore be considered as a complex quantity the ideal value whereof is $1+j0$.

Figure 3:
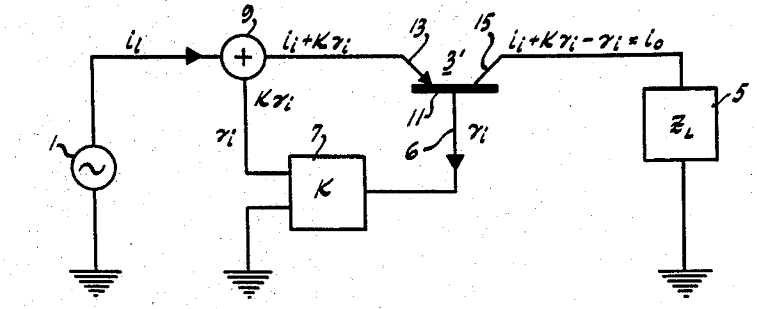
Fig. 3 is a drawing, generally similar to Fig. 2, wherein the generalized amplifier of Figs. 1 and 2 is replaced by a transistor connected to have a current gain approaching unity.

A particularly convenient application of the invention is illustrated in Fig. 3, wherein the amplifying element 3 is shown as a power transistor 3', having a base 11 which is common to the input and output circuits, an emitter 13 which serves as an input terminal and a collector 15 connected to the load 5. The transistor being a current-controlled, three-terminal device, the current $\gamma_1$ in the common base circuit is necessarily equal to the difference between the input and output currents. After being subjected to any changes symbolized by the constant K in the block 7 the current $K\gamma_1$ is added as by the adding circuit 9, to the input current $i_1$ from the source 1. The output current $i_0$ therefore becomes $i_1+K\gamma_1-\gamma_1$, all as indicated by the legends adjacent to the corresponding leads in the drawing.

Figure 4:
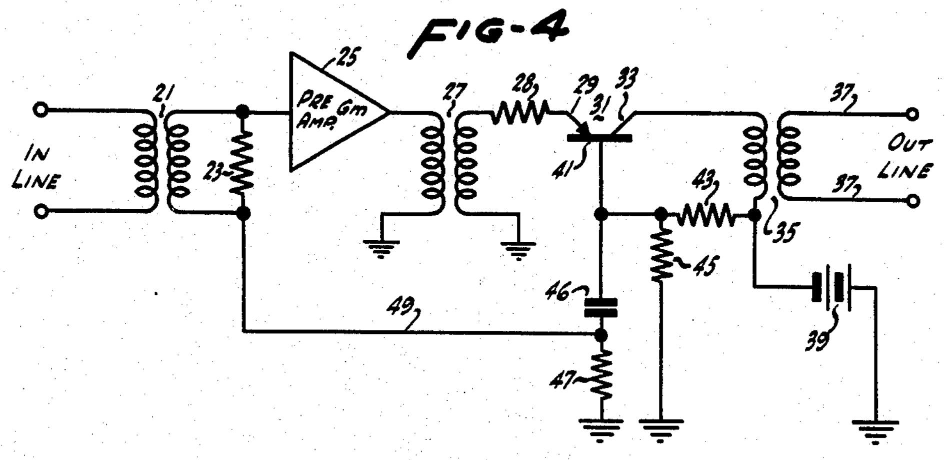
Fig. 4 is a schematic drawing showing a practical circuit employing the principles of the circuit symbolically illustrated in Fig. 3.

A more complete circuit diagram indicating one way in which the invention symbolically shown in Fig. 3 may be embodied in a practical amplifier, is shown in Fig. 4, which illustrates a telephone repeater circuit embodying the invention. In Fig. 4 a signal from an incoming line is supplied to a transformer 21, the secondary whereof is bridged by a resistor 23 to match the impedance of the line. It applies a signal having a voltage $V_{in}$ to a preamplifier 25. For the purposes of illustration it is assumed the preamplifier is of the vacuum tube type; i.e., it is voltage controlled. Preferably, it has a very high output impedance; for example, its output tubes are preferably pentodes having an output impedance of the order of a megohm, and sufficient feedback is incorporated in this amplifier so that the output current varies linearly with the input voltage, irrespective of any variation of impedance in its load circuit. The output current from the preamplifier is supplied through a transformer 27 and an emitter-stabilizing resistor 28 to the emitter 29 of a power transistor 31, to which the invention is applied.

In the apparatus illustrated in the figure the preamplifier used gives an output of 35 milliamperes per volt input. This, it will be noted, has the dimensions of a conductance, and the performance of the amplifier can be represented by a conductance, $G_m$ of 35 millimhos, this figure including the gain of a transformer 27 which supplies the emitter circuit of the transistor 31.

The collector 33 of the transistor connects to the primary coil of a transformer 35, the secondary coil of which feeds an outgoing line 37 while the primary coil connects to ground through a biasing battery 39. The base 41 of the transistor is provided with a suitable operating bias from the source 39 through a voltage divider, comprising a pair of resistors 43 and 45, the latter connecting to ground. The base 41 is isolated from ground as regards D.C. components by a blocking condenser 46; the signal components of the base current pass to ground through this condenser and a resistor 47. A lead 49 connects from the ungrounded end of resistor 47 to the low potential terminal of the secondary winding of transformer 21, thereby adding the voltage drop across the resistor resulting from the error-current $\gamma_1$ to the input voltage $V_{in}$. This added voltage is acted on by the preamplifier in precisely the same manner as the signal voltage, and therefore, in order to add to the input current to the transistor a current equal to the base current, the resistance R of the element 47 should be the reciprocal of $G_m$, or 28.6 ohms; stated otherwise, in this case $K=G_m\times R=1$.

A similar result can be obtained if the preamplifier is current controlled, the error signal being added to the message signal ahead of the preamplifier. This always involves the resolution of the constant K into two factors, which may be termed $m$ and $n$, such that $mn=K$, K being less than 2 and greater than 0.

Figure 5:
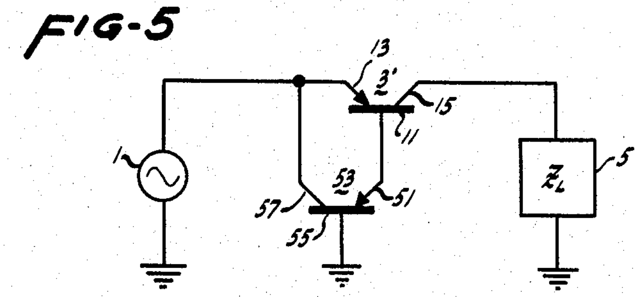
Fig. 5 is a diagram of an embodiment of the invention employing a transistor as the power amplifying element and a second, small-signal transistor as a means for adding the error signal to the original signal to be amplified.

An embodiment of the invention which, like that shown in Fig. 4, employs a transistor as the power amplifying element but wherein the feedback is accomplished in a single step illustrated in Fig. 5. This particular embodiment of the invention is covered specifically in a copending joint application for United States patent of the present inventor and James A. Stewart. The source 1 in this embodiment may be, for example, a preamplifier having a high output impedance, which connects to the emitter 13 of the power amplifier 3'. The base 11 connects to the emitter 51 of a small-signal transistor 53, the base 55 of which is grounded, its collector 57 connecting back to the emitter 13 of the power transistor 3'. The connections shown are only those carrying the alternating components, the biasing circuits and other incidental circuit elements being omitted for the sake of simplicity, since they conform to well established and known practice. In this arrangement the quantity K is substantially equal to the ratio of collector current to emitter current of the transistor 53, and commonly designated as $\alpha$, since the collector current will divide between the source 1 and the emitter 13 in inverse proportion to their resistances and since the output impedance of the source may be many thousand ohms while the input impedance of transistor 3' will normally be somewhere in the neighborhood of 50 ohms. The value of $\alpha$ for small-signal transistors ranges from about 0.975 to 0.99, making the value of K very close to unity.

Figure 6:
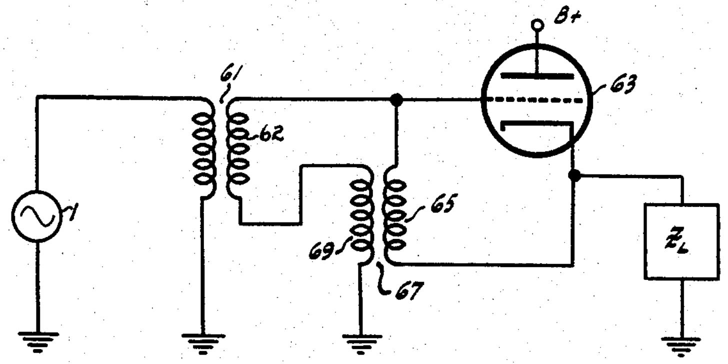
Fig. 6 is an illustration of an embodiment of the invention where a cathode follower tube having a voltage gain approaching unity is used as the amplifying element.

Fig. 6 is a circuit diagram illustrating the invention as applied to an amplifier wherein the voltage gain, rather than the current gain, approaches unity, i.e., a cathode-follower vacuum tube. In this figure the message signal from the source 1 is coupled through a transformer 61 having a secondary coil 62 connected to supply a message signal voltage $e_s$ to the grid of a triode 63. The load impedance $Z_L$ is connected from the cathode to ground and the primary coil 65 of a 1:1 transformer 67 is connected from grid connection of the tube to the cathode. The secondary coil 69 of the transformer 67 connects from the low potential side of the secondary coil 62 to ground.

As is well known, the potential of the cathode with respect to ground follows very closely the variations in potential of the grid, the difference depending upon the ratio of the effective output impedance of the tube to the impedance of the load. The voltage difference in this configuration becomes the error signal, which is reflected in the secondary winding 69 and added to the signal voltage applied to the grid. The voltage at the cathode therefore becomes equal to the signal voltage $e_s$. The quantity K can in this case, be made substantially equal to unity over a wide range of frequencies.

It should be apparent that the same principles as apply to the grounded base transistor are equally applicable to the grounded grid configuration in vacuum tube practice, where the invention may be applied in services where the cathode is driven negative with respect to the grid. Similarly an arrangement generally similar to that shown in Fig. 6 can be applied to a transistor amplifier connected in the grounded-collector configuration.

It can be shown that the following equations hold:

$$D=d(1-K) \qquad (1)$$

where $d$ is in the percentage distortion without feedback in accordance with this invention and D is the residual distortion with feedback. It follows that if $K=1$, $D=0$. It also follows that distortion is decreased as long as the absolute value of $1-K$ is less than 1; i.e., if K is greater than 0 and less than 2.

$$A_0=A+K\gamma-\gamma \qquad (2)$$

where $A_0$ is the output amplitude with feedback, A is the amplitude of the message signal and $\gamma$ as before, the amplitude of the error signal. This equation holds whether A represents a voltage or a current. Where $K=1$, $A_0=A$, and the gain of the amplifier becomes exactly equal to unity.

For current controlled amplifiers wherein it is the current gain that approaches unity, the output impedance of the amplifier $$Z_0'=Z_0\frac{1-K\gamma}{1-K} \qquad (3)$$

where $Z_0$ is the output impedance of the amplifier without feedback and $Z_0'$ is its output impedance with feedback. It will be seen that $Z_0'$ becomes infinite where $K=1$.

When applied to amplifier configurations wherein the voltage gain rather than the current gain approaches unity, the effect on the output impedance is the inverse of that indicated by Equation 3 just given; i.e., $$Z_0''=Z_0\frac{1-K}{1-K\gamma} \qquad (4)$$

where $Z_0$" is the output impedance with feedback and $Z_0$, again, the output impedance of the amplifier without feedback. Where $K=1$, $Z_0''$ becomes 0 and the output voltage independent of the impedance of the load circuit.

There are a number of features of the present invention which, because of their marked difference from other types of feedback, deserve special emphasis. One of the most important of these features is the inherent stability of the arrangement at all frequencies and under all conditions of operation. Instability occurs in feedback circuits wherein the gain around the feedback loop is equal to unity and is positive. Even where the feedback is nominally negative there may occur situations where phase rotation within the feedback circuit, at frequencies beyond the limits of the designed band, reverse the phase of the feedback and cause instability. With the present invention the quantity fed back is always less than the signal input, being the difference between the input and output signals, and it is this small signal that is applied back to the input at substantially its original amplitude. As long as the amplifier is supplying power and K is within the limits given above, therefore, instability cannot occur.

Another feature, distinguishing the present invention from certain prior suggestions wherein an error signal is fed back, is that it is fed back at its original amplitude, as near as may be, and effects cancellation of distortion with a gain around the feedback loop of unity. It does not rely on a high loop gain for either the error component or the total output. In spite of this fact a complete cancellation of the error is possible, instead of a partial cancellation which becomes more nearly complete as the gain in the feedback loop is increased. No gain needs to be supplied to the difference or error signal in an external feedback loop.

A still further distinguishing feature is that the overall gain of the amplifier with feedback is increased instead of being reduced as in the usual negative feedback case. The increase in gain occurs by virtue of two different effects; first, the increase in amplitude of the output signal, which is relatively slight, and second, the change in effective output impedance of the feedback amplifier. The amount of power gain that can be realized as a result of these two effects is limited, of course, by the current or voltage limitations of the amplifying element itself. The amplifiers of Fig. 3 and 4 and 5 have an output impedance approaching infinity and hence, in theory, should be able to maintain an output current equal to their input current in a load circuit of infinite impedance. This, of course, they cannot do, since it would require an infinite output voltage, whereas the actual output message-signal voltage cannot exceed the permissible collector voltage of the power transistor.

Similarly, the output current of the arrangement shown in Fig. 6 is limited by the current-carrying capacity of the tube, even though its output impedance is effectively zero and a matched output would therefore also have a zero impedance. It would, however, require infinite current to maintain the unity voltage gain into such a zero impedance. Within the limitations of the amplifying device itself, however, tests of the invention show close conformity to theory. Within these limitations amplifiers using feedback of this character become almost perfect "constant current" or "constant voltage" devices, as the case may be.

It may or may not be possible to take advantage of all of the additional gain offered by the effective change in output impedance. If the output impedance must be matched to the impedance of the line, in order to prevent reflections, for example, a portion of the additional gain will in general have to be sacrificed in order to obtain a match. Various ways are known of securing such a match; for example, where the output impedance to the amplifier becomes infinity a 6 db negative feedback by any of several known procedures will accomplish the result, while where the output impedance drops to zero, as in the case of Fig. 6, a line-matching series resistor between the cathode and the load will have the same effect. In other cases, where a match is not necessary, a relatively large increase in gain without accompanying distortion is possible; for example, the arrangement of Fig. 6 can be used as a driver stage for a Class C amplifier wherein grids swing far positive and draw current. The amplifier will maintain the grid voltage of the type C stage in spite of the nonlinear characteristics of the load.

It should be emphasized that the quantity K may be a complex number, and that complete or substantially complete cancellation of distortion depends upon its real component being close to unity and its imaginary component close to zero. With any of the arrangement shown this condition is easy to attain except at frequencies approaching the upper limit of the band that the amplifier is intended to handle. Even so, it is possible to manipulate the quantities in the feedback loop so as to extend the frequency band that will be handled by the power element without material distortion by several octaves.

For example, in the case of the arrangement of Fig. 5, the frequency characteristics of the amplifier as a whole depend primarily on those of the transistor 53 and are nearly independent of the characteristics of transistor 3' up to the point where the error current exceeds the power handling capabilities of the transistor 53. The high frequency cut off of a transistor is a function primarily of the capacity between the base and the emitter and collector respectively, which effectively by-pass the signal currents to the base. The capacitive components flow in the connection from the base 11 to the emitter 51 and appear as a component of $\gamma$. The small-signal transistor 53, however, will usually have much better high-frequency characteristics than the power transistor and therefore it will not be until transistor 53 begins to approach its high-frequency cut off or the error signal exceeds the power-handling ability of the small-signal transistor, whichever occurs first, that the output of the amplifier as a whole is materially affected.

The various embodiments of the invention shown and described herein are but a few of those possible and are not intended to limit the scope of the invention as it is defined in the following claim.

I claim:

In a power amplifier producing output signals of lesser amplitude than the amplitude of input signals and including a multi-element vacuum tube connected in cathode-following arrangement to a load circuit, an input transformer having a primary winding connected to receive input signals and a secondary winding connected at one end thereof to a control electrode of said vacuum tube, and a control transformer of substantially one-to-one transformation and having a first winding connected between the control electrode and cathode of said vacuum tube and a second winding connected in series between the secondary winding of said input transformer and ground for adding to input signals thereat a control signal proportional to the difference between input and output of said vacuum tube.

References Cited in the file of this patent

UNITED STATES PATENTS

| | | |
|---|---|---|
| 2,252,049 | Terman | Aug. 12, 1941 |
| 2,660,624 | Bergson | Nov. 24, 1953 |
| 2,709,205 | Colls | May 24, 1955 |
| 2,714,136 | Greenwood | July 26, 1955 |
| 2,744,168 | Gilbert | May 1, 1956 |
| 2,748,201 | McMillan | May 29, 1956 |
| 2,749,441 | Kelley | June 5, 1956 |
| 2,751,442 | Ketchledge | June 19, 1956 |
| 2,835,748 | Ensink et al. | Nov. 20, 1958 |

FOREIGN PATENTS

| | | |
|---|---|---|
| 853,531 | France | Dec. 7, 1939 |

OTHER REFERENCES

Publication: Proceedings of the I.R.E., vol. 28, No. 2, February 1940, pages 59–66, by Pedersen, "A Distortion Free Amplifier."